(12) United States Patent
Bollenbeck

(10) Patent No.: US 10,670,673 B2
(45) Date of Patent: Jun. 2, 2020

(54) DEVICE AND METHOD FOR TRANSMITTING SIGNALS OVER A SHIELDED BALANCED LINE

(71) Applicant: Jan Bollenbeck, Eggolsheim (DE)

(72) Inventor: Jan Bollenbeck, Eggolsheim (DE)

(73) Assignee: Siemens Healthcare GmbH, Erlangen (DE)

( * ) Notice: Subject to any disclaimer, the term of this patent is extended or adjusted under 35 U.S.C. 154(b) by 92 days.

(21) Appl. No.: 15/613,196

(22) Filed: Jun. 3, 2017

(65) Prior Publication Data

US 2017/0350950 A1 Dec. 7, 2017

(30) Foreign Application Priority Data

Jun. 3, 2016 (EP) ..................... 16172882

(51) Int. Cl.
| | | |
|---|---|---|
| *G01R 33/36* | (2006.01) | |
| *G01R 33/341* | (2006.01) | |
| *H01P 3/06* | (2006.01) | |
| *H01P 3/08* | (2006.01) | |

(52) U.S. Cl.
CPC ....... *G01R 33/3621* (2013.01); *G01R 33/341* (2013.01); *G01R 33/36* (2013.01); *G01R 33/3685* (2013.01); *H01P 3/06* (2013.01); *H01P 3/08* (2013.01)

(58) Field of Classification Search
None
See application file for complete search history.

(56) References Cited

U.S. PATENT DOCUMENTS

| | | | | |
|---|---|---|---|---|
| 2007/0279061 A1* | 12/2007 | Erickson | ............ | G01R 33/345 324/322 |
| 2009/0076378 A1* | 3/2009 | Misic | ............... | A61B 5/055 600/423 |
| 2009/0079428 A1 | 3/2009 | Nistler | | |
| 2009/0286478 A1 | 11/2009 | Biber | | |
| 2010/0201365 A1 | 8/2010 | Bollenbeck | | |

(Continued)

FOREIGN PATENT DOCUMENTS

| | | |
|---|---|---|
| CN | 101398471 A | 4/2009 |
| CN | 101581771 A | 11/2009 |

(Continued)

OTHER PUBLICATIONS

European Search Report for European Application No. 16172882.9-1568, dated Dec. 16, 2016, with English Translation.

(Continued)

*Primary Examiner* — Douglas X Rodriguez

(74) *Attorney, Agent, or Firm* — Lempia Summerfield Katz LLC

(57) ABSTRACT

A transmitting device and a method for transmitting two high frequency signals for a magnetic resonance tomograph are provided. The transmitting device includes a shielded balanced transmission line, a first signal driver, and a second signal driver. The first signal driver and the second signal driver feed the first high frequency signal to a first conductor and the second high frequency signal to a second conductor of the balanced transmission line. A shielding of the balanced transmission line has an electrical connection to a common ground potential for the first signal driver and the second signal driver.

18 Claims, 3 Drawing Sheets

(56) References Cited

U.S. PATENT DOCUMENTS

| | | | |
|---|---|---|---|
| 2011/0215807 | A1 | 9/2011 | Misic et al. |
| 2015/0061676 | A1* | 3/2015 | Höcht |
| 2017/0084973 | A1* | 3/2017 | Badihi .................. H01P 3/026 |
| 2017/0322267 | A1 | 11/2017 | Biber |

FOREIGN PATENT DOCUMENTS

| | | |
|---|---|---|
| CN | 101806873 A | 8/2010 |
| CN | 102257405 A | 11/2011 |
| CN | 104422913 A | 3/2015 |
| DE | 4109863 A1 | 10/1992 |
| JP | 2009534098 A | 9/2009 |
| JP | 2012508617 A | 4/2012 |
| WO | WO2004012367 A3 | 4/2004 |
| WO | WO2012003211 A1 | 1/2012 |

OTHER PUBLICATIONS

Chinese Office Action for Chinese Application No. 201710412881.1 dated Apr. 24, 2019, with English Translation.
Korean Notice of Preliminary Rejection for related Korean Application No. 10-2017-0069057 dated Jan. 30, 2019, with English translation.
Trinler Net "Network FAQ" obtained from https://www.trinler.net/service/doc/nfaq/ on Apr. 16, 2019. pp. 1-29.
Wikipedia "Twisted-Pair" obtained from https://en.wikipedia.org/wiki/Twisted_pair on Mar. 29, 2019. pp. 1-8.
Chinese Office Action for Chinese Application No. 201710412881.1 dated Nov. 14, 2019, with English translation.

* cited by examiner

DEVICE AND METHOD FOR TRANSMITTING SIGNALS OVER A SHIELDED BALANCED LINE

This application claims the benefit of EP 16172882.9, filed on Jun. 3, 2016, which is hereby incorporated by reference in its entirety.

BACKGROUND

The present embodiments relate to a transmitting device for transmitting two high frequency signals, and a magnetic resonance tomograph with a transmitting device.

Magnetic resonance tomographs are imaging devices that, in order to map an object being investigated, align nuclear spins of the object being investigated with the aid of a powerful external magnetic field, and excite the nuclear spins to precess about this alignment by an alternating magnetic field. The precession or return respectively of the spins from this excited state into one with lower energy generates, as a response, an alternating magnetic field (e.g., a magnetic resonance signal) that is received via antennas.

With the aid of magnetic gradient fields, a local coding that subsequently enables an allocation of the received signal to a volume element is placed on the signals. The received signal is then analyzed, and a three-dimensional imaging representation of the object being investigated is provided.

To excite the precession of the spins, alternating magnetic fields with a frequency corresponding to the Larmor frequency at the respective static magnetic field strength and very high field strengths or powers, respectively, are provided. To improve the signal-to-noise ratio of the magnetic resonance signal received by the antennas, antennas (e.g., local coils) that are arranged directly at the patient are frequently used.

For imaging, the magnetic resonance signals received by the local coil are to be transmitted to a receiving facility of the magnetic resonance tomograph. In the case of a local coil with a plurality of antenna coils arranged in a matrix, this may involve a plurality of signals to be transmitted independently of each other in this regard.

Coaxial cables, which are costly and difficult to process especially in thin and flexible implementations, are customarily used for transmitting the signals. But even thin coaxial cables may be bulky and hard to handle when bunched together.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a transmitting device and a magnetic resonance tomograph that are simpler to handle and more cost-effective are provided.

The transmitting device is intended for transmitting a first high frequency signal and a second high frequency signal for a magnetic resonance tomograph. The first high frequency signal and the second high frequency signal differ (e.g., the second high frequency signal is also not an inverted first high frequency signal). In other words, the first high frequency signal and the second high frequency signals are signals that are independent of each other and are not just directly derived from each other (e.g., by an active or passive component). The first high frequency signal and the second high frequency signal therefore differ from the otherwise usual signals on a balanced line, which just differ by the sign of the amplitude and are generated from a common signal by a transformer, a complex network, or a transistor, for example.

The transmitting device has a shielded balanced transmission line for transmitting the first high frequency signal and the second high frequency signal. For example, the shielded balanced transmission line may include a shielded conductor pair of a LAN cable, such as, for example, CAT 7, but other balanced transmission lines such as flat webbed cable, stripline on a flexible printed circuit board, and the like may be provided.

The transmitting device has a first signal driver. A first signal input of the first signal driver is configured to receive the first high frequency signal, and a first signal output of the first signal driver has an electrical connection to a first conductor of the balanced transmission line. The first signal driver may be an active amplifier circuit, but passive networks may also be provided as signal drivers.

The transmitting device has a second signal driver. A second signal input of the second signal driver is configured to receive the second high frequency signal, and a second signal output of the second signal driver has an electrical connection to a second conductor of the balanced transmission line. In other respects, the statements made for the first signal driver may also be applied to the second signal driver.

In the case of the transmitting device of one or more of the present embodiments, a shielding of the balanced transmission line has an electrical connection to a common ground potential or reference potential, respectively, for the first signal output and the second signal output. This connection may be ohmic and/or has a small resistance (e.g., less than 10 Ohm, 5 Ohm, 1 Ohm or 0.1 Ohm).

The transmitting device of one or more of the present embodiments enables the use of individual conductors of a shielded balanced transmission line as individual, weakly coupled coaxial cables for essentially independent transmission of two different signals. Thus, a cost effective and more simply handled cable may be used for a magnetic resonance tomograph.

The magnetic resonance tomograph and the transmission method share the advantages of the transmitting device.

In an embodiment of the transmitting device, the transmitting device is configured to transmit the first high frequency signal and the second high frequency signal independently of each other. In this regard, transmit independently of each other may be in the context that the first high frequency signal is provided on the first conductor at the end of the transmission line that is oppositely located to the feed-in point of the signal drivers, and the second high frequency signal on the first conductor has an attenuation of more than 20 dB, 30 dB, or 40 dB with respect to the first high frequency signal. The second high frequency signal is provided on the second conductor at the end of the transmission line, and the first high frequency signal has, on the second conductor, an attenuation of more than 20 dB, 30 dB, or 40 dB with respect to the second high frequency signal.

In one embodiment of the transmitting device, a length of the transmission line essentially corresponds to an integer multiple m of a half effective wavelength of the first high frequency signal and to an integer multiple n essentially of a half effective wavelength of the second high frequency signal. In this regard, the effective wavelength is referred to the center frequency and is dependent on a vacuum wavelength using shortening factor that is dependent on the geometry of the shielded balanced transmission line and the materials used (e.g., dielectric constant). "Essentially correspond" in this regard may be the length of the transmission line deviating from an integer multiple of the half effective wavelengths by less than 5%, 10%, 20%, or 30%. In one embodiment, the effective wavelengths of the first high frequency signal and the second high frequency signal are essentially the same, and therefore, the integer numbers n and m are the same. "Essentially the same" may be, in this regard, the frequency ranges of the two signals overlapping or the center frequencies differing by a maximum of 1%, 5%, 10%, or 20%. In one embodiment, however, the first high frequency signal and the second high frequency signal to be transmitted may have different center frequencies, and m and n are different integer numbers.

In the case of lengths of the transmission line that correspond to an integer multiple of the half effective wavelength, a maximum of the decoupling of the first high frequency signal and the second high frequency signal is advantageously produced so that an attenuation of the respective other signal at the end of the transmission line of more than 20 dB, 30 dB, or 40 dB may be achieved. Frequency grids are used in the selection of frequencies used in a magnetic resonance tomograph. To avoid interference by harmonic waves, frequencies with a multiple of a fundamental frequency may be used. Lengths of the transmission line for which the condition is satisfied for different signal frequencies may be determined.

In an embodiment of the transmitting device, the first conductor of the balanced transmission line has an electrical connection to the second conductor via a decoupling resistor at an end of the transmission line that is remote from the first signal driver and the second signal driver.

A resistor at an end remote from the first signal driver and the second signal driver (e.g., load-side end of the transmission line) is capable, due to the phase shift over the length of the transmission line, of compensating at least partly for a crosstalk arising between the conductors and thus of further improving the transmission properties.

In an embodiment of the transmitting device, the decoupling resistor has a complex impedance.

A complex decoupling resistor between the conductors at the load-side end may compensate even better for a crosstalk on the transmission line by suitable frequency and phase dependency.

In an embodiment of the transmitting device, a plurality of balanced transmission lines, first signal drivers, and second signal drivers are provided for transmitting a plurality of first high frequency signals and second high frequency signals. In this regard, each transmission line may have a separate shielding for the respective pair of first conductor and second conductor, or a plurality or all of the balanced transmission lines may have a common shielding that then surrounds the balanced transmission lines jointly.

By using cables with a plurality of balanced conductor pairs (e.g., twisted-pair LAN cables), the transmitting device of one or more of the present embodiments enables cost effective transmission of a plurality of high frequency signals.

In one embodiment of the transmitting device, the first conductor and the second conductor of the balanced transmission line are in each case terminated for the purpose of shielding by a terminating resistor at an end of the transmission line that is remote from the first signal driver and the second signal driver. In this regard, the terminating resistor may have an impedance that essentially corresponds to the impedance of the transmission line (e.g., the amount of the terminating resistor diverges by a maximum of 10%, 20%, 50%, or 100% from an amount of the impedance of the transmission line). However, other values may also be provided for the impedance of the terminating resistor based on the lambda/2 transformation described below in the description of the figures.

A termination of the transmission line with a resistor that corresponds to the impedance of the transmission line provides that reflections on the transmission line are reduced.

In an embodiment of the transmitting device, the first high frequency signal has a first center frequency and the second high frequency signal has a second center frequency. The first center frequency and the second center frequency are different. "Different" in this regard may be that the first center frequency diverges from the second center frequency by more than 30%, 50%, 100%, or a multiple.

The transmitting device of one or more of the present embodiments is capable of transmitting different signals independently of each other even in different frequency ranges. "Independently" may be a decoupling of the first high frequency from the second high frequency signal at an end of the transmission line oppositely located to the signal drivers and an attenuation of the respective other signal by more than 10 dB, 20 dB, 30 dB, or 40 dB.

The method shares the advantages of the device.

The properties, features, and advantages of the present embodiments described above and the manner in which the properties, features, and advantages are achieved will become more clearly and more plainly understandable in conjunction with the following description of the exemplary embodiments, which are explained in more detail in conjunction with the drawings.

DETAILED DESCRIPTION

Figure 1:
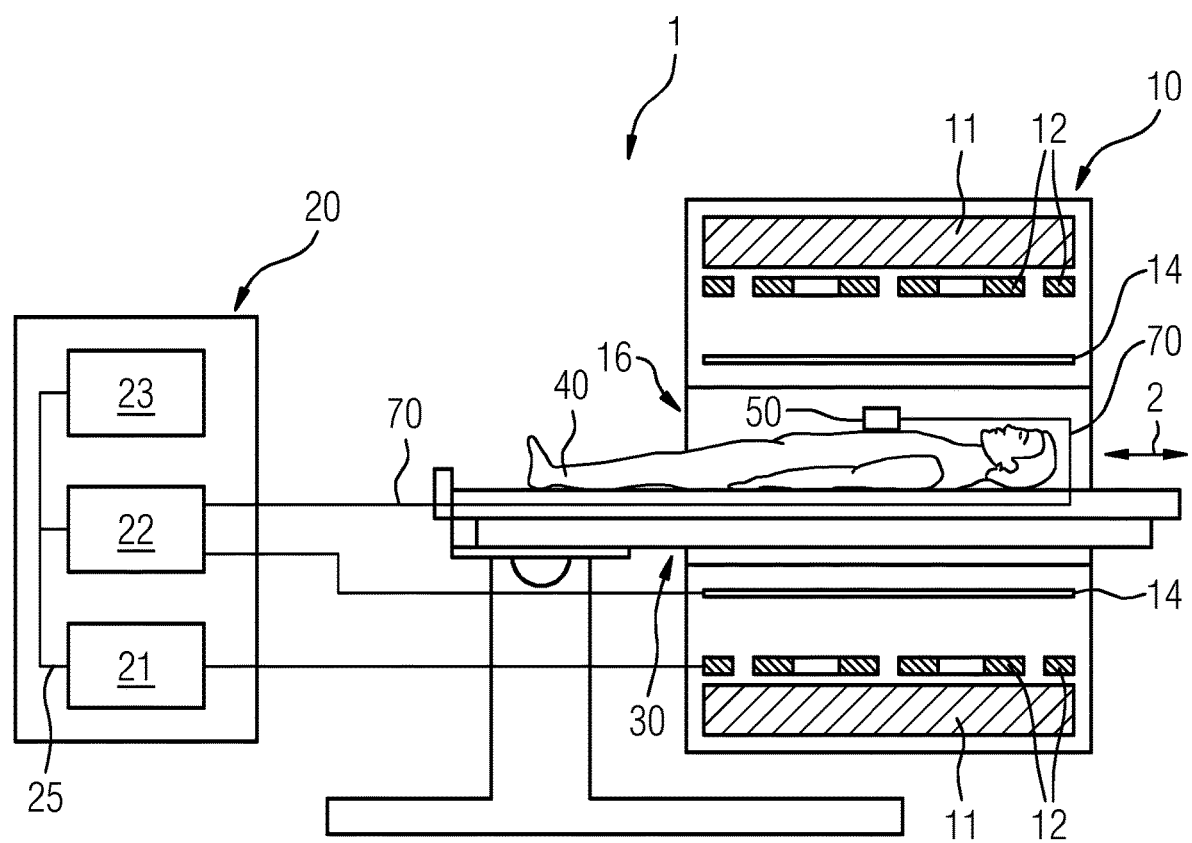
FIG. 1 shows a schematic representation of an embodiment of a magnetic resonance tomograph.

FIG. 1 shows a schematic representation of an embodiment of a magnetic resonance tomograph 1 with a transmitting device 70.

The magnet unit 10 includes a field magnet 11 that generates a static magnetic field B0 for aligning nuclear spins of specimens or in the body of a patient 40 in a recording zone. The recording zone is arranged in a patient tunnel 16 that extends in a longitudinal direction 2 through the magnet unit 10. The field magnet 11 may include a superconducting magnet that may provide magnetic fields with a magnetic flux density of up to 3 T or even higher in the most modern machines. However, permanent magnets or electromagnets with normally conducting coils may also be used for lower field strengths.

The magnet unit 10 also includes gradient coils 12 that are configured to superimpose variable magnetic fields in three spatial directions on the magnetic field B0 for the purpose of spatial differentiation of the captured mapping zones in the investigated volume. The gradient coils 12 may be coils consisting of normally conducting wires that may generate orthogonal fields with respect to each other in the investigated volume.

The magnet unit 10 also has a body coil 14 that is configured to direct into the investigated volume a high frequency signal supplied via a signaling line, receive resonance signals emitted by the patient 40, and deliver the resonance signals via a signaling line. The magnetic resonance tomograph of one or more of the present embodiments has one or more local coils 50 that are arranged close to the patient 40 in the patient tunnel 16.

A control unit 20 supplies the magnet unit 10 with the various signals for the gradient coils 12 and the body coil 14, and analyzes the signals received.

Thus, the control unit 20 has a gradient activation system 21 that is configured to supply the gradient coils 12 with variable currents via feeder leads. The variable currents provide the desired gradient fields in the investigated volume in a time-coordinated manner.

The control unit 20 also has a receiving unit 22 that is configured to generate a high frequency pulse with a predetermined time profile, amplitude, and spectral power distribution for exciting a magnetic resonance of the nuclear spins in the patient 40. In this regard, pulse powers in the kilowatt range may be reached. The individual units are connected to each other via a signal bus 25.

The local coil 50 may receive a magnetic resonance signal from the body of the patient 40 since due to the small distance, the signal-to-noise ratio (SNR) of the local coil 50 is better than in the case of a reception by the body coil 14. The MR signal received by the local coil 50 is processed in the local coil 50 and forwarded by using the transmitting device 70 of one or more of the present embodiments to the receiving unit 22 of the magnetic resonance tomograph 1 for analysis and image capture. In this regard, parts of the transmitting device 70 may also be provided in a housing of the local coil 50.

Figure 2:
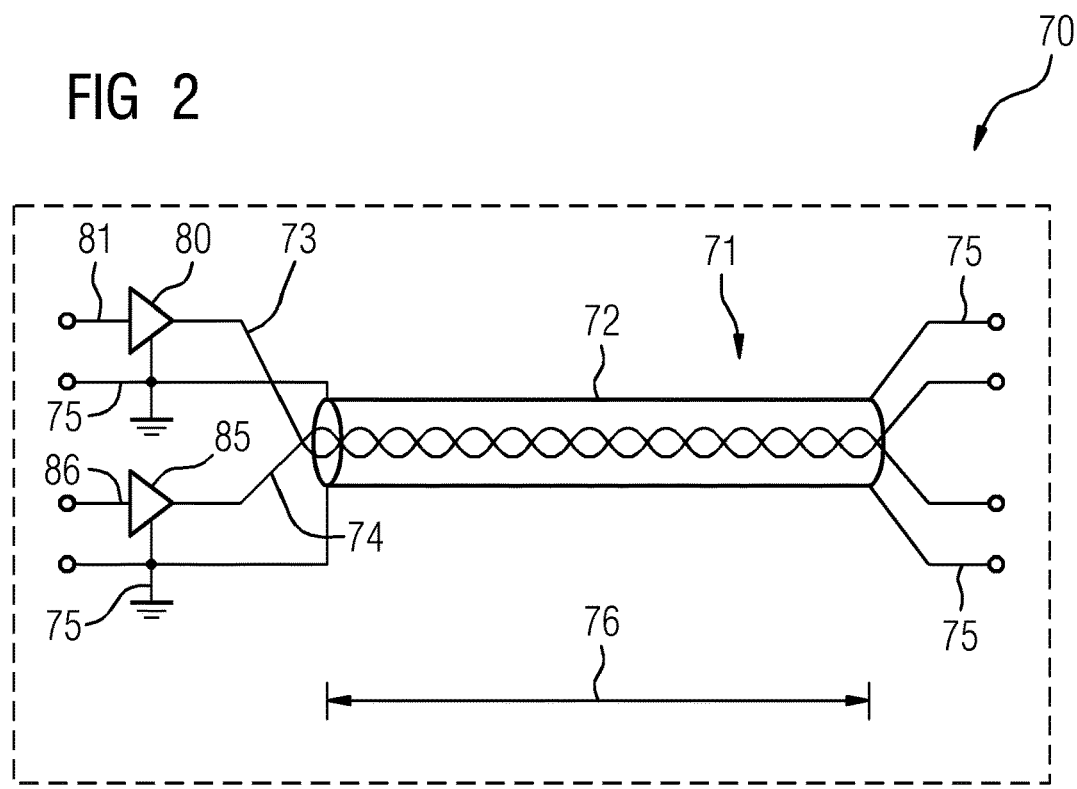
FIG. 2 shows a schematic representation of an embodiment of a transmitting device.

FIG. 2 shows a possible embodiment of a transmitting device in a schematic representation.

The transmitting device 70 of one or more of the present embodiments has a balanced transmission line 71 in the case of which a first conductor 73 and a second conductor 74, separated by a dielectric medium, and enclosed by a shielding 72, extend along a longitudinal dimension of the transmission line 71. In this regard, the first conductor 73 and the second conductor 74 may be twisted together as indicated in the drawing. Examples of transmission lines of this type include LAN cables (e.g., CAT 7 cable), in which a plurality of conductor pairs are bunched together. In this regard, the shielding 72 may be formed by a conductive foil or a wire mesh, for example. In one embodiment, the first conductor 73 and the second conductor 74 may be arranged parallel to each other at an essentially predetermined spacing along the longitudinal dimension.

In one embodiment, the first conductor 73 and the second conductor 74, and also the shielding 72, may be assembled with a plug connector at one or both ends of the transmission line (e.g., an RJ-45 connector plug) for a detachable electrical connection.

In one embodiment, a plurality of conductor pairs may be routed in a common shielding without being shielded with respect to each other by pair-based shielding (e.g., LAN CAT 6 cable with the designation S/UTP ("Screened Unshielded Twisted Pair")).

The transmitting device 70 also has a first signal driver 80 with a first signal input 81 and a second signal driver 85 with a second signal input 86 for feeding two independent high frequency signals, respectively. A reference potential or ground potential 75, respectively, is used as a reference potential for the first high frequency signal and the second high frequency signal. The first high frequency signal and the second high frequency signal are seen as independent in this regard if the first high frequency signal and the second high frequency signal are not derived directly from each other by a simple passive or active circuit. For example, such high frequency signals as are usually generated from a single signal by inversion or phase shifting, respectively, for the use of balanced transmission lines are not considered to be independent, so that the first conductor and the second conductor carry opposite voltage in each case and a crosstalk signal is compensated by the opposite signal of the other conductor. The composite signal of independent high frequency signals is also not essentially equal to zero on a permanent basis so that a reference potential or a signal ground respectively is to be provided after the transmission line for the first high frequency signal and the second high frequency signal.

In the first signal driver 80 and the second signal driver 85, the first high frequency signal and the second high frequency signal are amplified and/or matched to an impedance connected to the first signal output 82 or the second signal output 87, respectively. In this regard, the first signal driver 80 and the second signal driver 85 may be active amplifier circuits or even just passive matching networks.

In this regard, the first signal output 82 has an electrical connection to the first conductor 73 and the second signal output 87 has an electrical connection to the second conductor 74. An impedance of the first conductor 73 and the second conductor 74 as a load impedance at the signal outputs is determined in this regard by the geometry of the transmission line 71 and also the materials used. As explained below with reference to FIG. 3, the impedance may also be influenced by terminating resistors. The ground potential 75 that forms the reference potential for the first signal input 81 and the second signal input 86 is also simultaneously the reference potential for the first signal output 82 and the second signal output 87, and has an electrical connection both to the first signal driver 80 and the second signal driver 85, and the shielding 72 (e.g., ohmic).

The first signal driver 80 and the second signal driver 85 may be provided in a housing of the local coil 50, or the first signal driver 80 and the second signal driver 85 may be provided in a separate housing, in a housing of a plug connector, or in the case of a signal transmission from the control unit 20 to the local coil 50, also in a housing of the control unit 20 in the form of a component.

The transmission line 71 may have a length 76 that is an integer multiple of the shortened effective half wavelength of the first high frequency signal and the second high frequency signal. A shortening factor is produced by the geometry and the materials used (e.g., a corresponding dielectric constant) of the transmission line 71. A typical value for the shortening factor is between 0.6 and 0.7 in the case of a CAT 7 cable. With regard to lengths 76 that are a multiple of the shortened half wavelength of the first high frequency signal and/or the second high frequency signal, minima are produced in the crosstalk between the first high frequency signal and the second high frequency signal at the end of the transmission line 71 that is oppositely located to the first signal driver 80 and the second signal driver 85.

Additionally, the influence of the prevailing line impedance on the signal transmission is reduced in the case of these length ratios since, due to the lambda/2 transformation at the line input, the load impedance present at the line end always appears. This makes it possible to use cable arrangements not configured for this application at, for example, 50 Ω line impedance.

Figure 4:
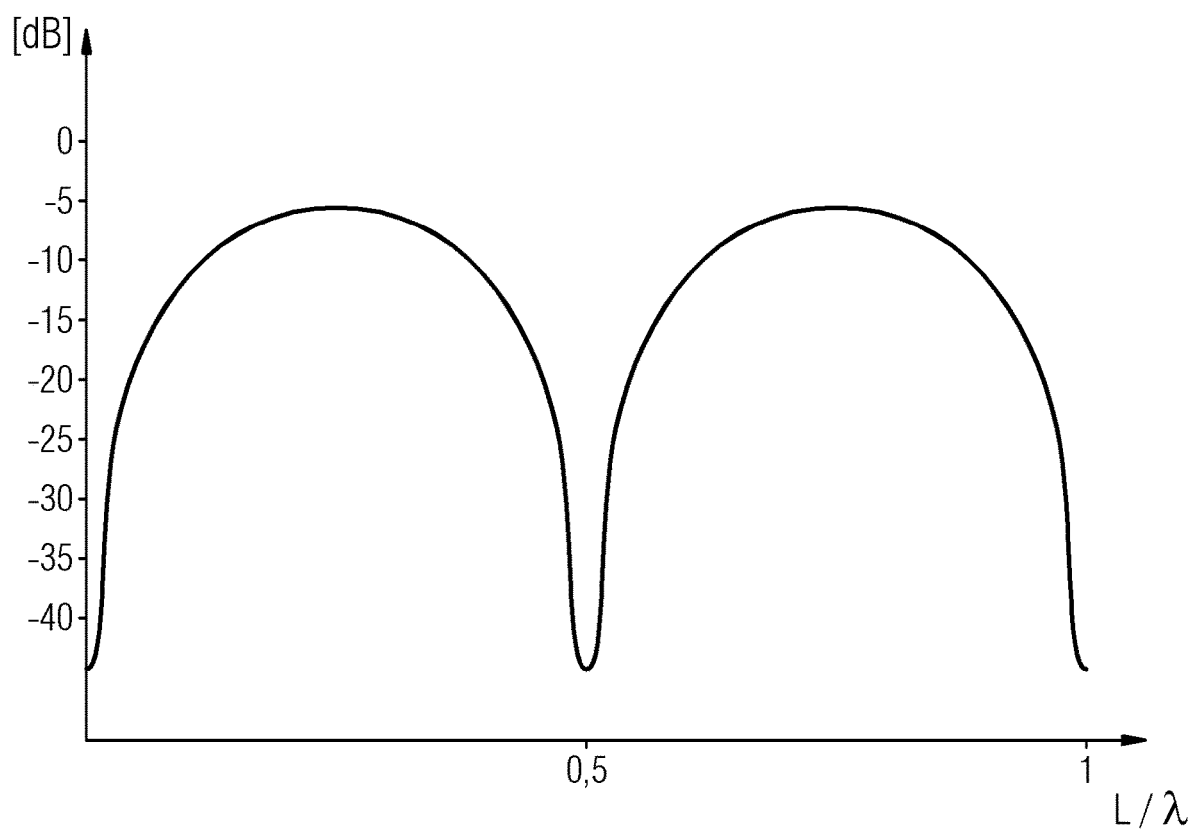
FIG. 4 shows an exemplary profile of a crosstalk attenuation one embodiment of a transmitting facility.

FIG. 4 shows an exemplary profile of the crosstalk attenuation in a transmitting facility (e.g., transmitting device) of one or more of the present embodiments. The horizontal axis indicates the ratio of the length divided by the effective wavelength, which at the same time corresponds to an increasing frequency toward the right. The vertical axis indicates the level of the respective other high frequency signal in decibels with reference to the high frequency signal to be transmitted at the end of the transmission line 71 that is oppositely located to the first signal driver 80 and the second signal driver 85. In this regard, the level fluctuates between −5 dB in the case of an unfavorable length 76 of the transmission line 71 and −40 dB in the case of an ideal length $L=lambda_{eff}*n/2$ where n is a natural number. In this regard, the maximum attenuation is dependent on the properties of the transmission line and may include typical values between 15 dB and 45 dB or more. The attenuation is produced as the amount of the level relationship.

If the first high frequency signal and the second high frequency signal have different center frequencies and effective wavelengths $\lambda_1$, $\lambda_2$, then it is possible in one embodiment of the transmitting device 70 to select the length of the transmission line 70 L as $L=(n*\lambda_1)/2=(m*\lambda_2)/2$ where n and m are natural numbers.

FIG. 4 also illustrates that the minimum in the crosstalk attenuation has a certain width with reference to length over effective wavelength and therefore also with reference to the frequency of the first high frequency signal or the second high frequency signal, respectively A signal with a certain bandwidth may be transmitted without the crosstalk attenuation becoming too great. Here it is necessary to weigh up between required bandwidth and minimum permissible crosstalk attenuation as a function of the properties of the transmission line 71.

Figure 3:
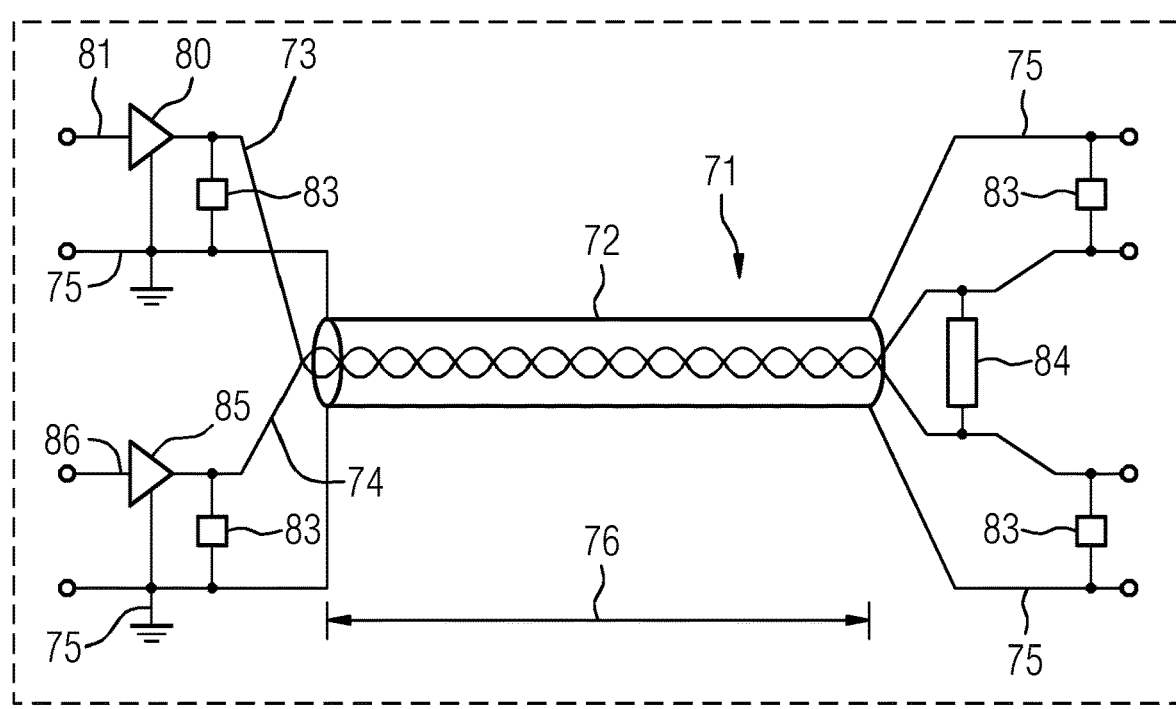
FIG. 3 shows an exemplary schematic representation of an embodiment of a transmitting device.

FIG. 3 represents an embodiment of the transmitting device 70. Same objects are designated with same reference symbols.

The transmitting device 70 in FIG. 3 differs from the transmitting device in FIG. 2 by the terminating resistors 83. By using the terminating resistors 83, reflections may be reduced on the transmission line 71 if the output impedance of the first signal driver 80 and the second signal driver 85 do not correspond to the line impedance of the transmission line 71 or a load connected at the opposite end to the signal drivers has a different input impedance.

At the same time or also independently of the terminating resistors 83, the first conductor 73 and the second conductor 74 may be connected by a decoupling resistor 84 at the end of the transmission line 71 oppositely located to the signal drivers. Due to the phase shift through the length 76 of the transmission line 71 where $L=lambda_{eff}*n/2$, an opposite sign of the first high frequency signal with respect to the crosstalk signal injected on to the second conductor 74 provides that the crosstalk attenuation may be improved, and vice versa, for the second high frequency signal.

In FIG. 2 and FIG. 3, the electrical connection between the first signal output 82 and the first conductor 73 or the second signal output 87 and the second conductor 74, respectively, is only indicated schematically, and the nature of the electrical connection is not defined in further detail. This electrical connection may include, in the case of a small length (e.g., a length less than one-tenth of the effective wavelength $lambda_{eff}$ of the high frequency signal to be transmitted), simple electrical wire connections or leads on a printed circuit board. In the case of greater lengths, however, wave phenomena such as reflection become relevant so that waveguides, such as, for example, coaxial leads or striplines, where relevant with terminating resistors, may provide the electrical connection.

In an embodiment of the transmitting device, the transmission line 71 may also have a plurality of pairs of first conductor 73 and second conductor 74 that are equipped with a separate shielding 72 in each case. For example, a LAN cable of category CAT 7 has in total four conductor pairs with corresponding shielding so that with a CAT 7 cable, a transmitting device 70 of one or more of the present embodiments is made available for transmitting a total of eight mutually independent high frequency signals.

In a further embodiment of the transmitting device, the transmission line 71 may also have a plurality of pairs of first conductor 73 and second conductor 74 that taken together are just equipped with a common shielding 72, but are not equipped with a separate shielding 72 on a paired basis. This includes, for example, LAN cables with the designation S/UTP ("Screened Unshielded Twisted Pair").

The first high frequency signal or the second high frequency signal may be magnetic resonance signals, for example, that are recorded by a plurality of antenna coils of a local coil 50. In this regard, these signals may be amplified by a pre-amplifier (LNA), for example, or also converted to a lower intermediate frequency by mixing with the aid of a local oscillator. In one embodiment, the local oscillator signal is provided as a reference for further processing and is likewise one of the high frequency signals to be transmitted.

In one embodiment of the magnetic resonance tomograph 1, a further compensation of the crosstalk may be implemented in a signal processing function after the transmitting device. For example, the receiving unit 22 may be configured by a passive compensation network or also by a digital signal processing function to reduce components of the second high frequency signal in the transmitted first high frequency signal. If the properties of the transmitting device 70 are known (e.g., the degree of crosstalk and the phase relation), then a corresponding compensation signal with reverse sign may be generated in a digital or analog manner, and a further reduction in the crosstalk may be achieved by summation of the signals.

The method for transmitting a first high frequency signal and a second high frequency signal of one or more of the present embodiments is carried out on a magnetic resonance tomograph 1 with a transmitting device 70, as already described. During the transmission method, the first high frequency signal is fed to the first signal input 81 of the first signal driver 80 and sent on at the first signal output 82 to the first conductor 73 of the transmission line 71. Similarly, the second high frequency signal is fed to the second signal input 86 of the second signal driver 85 and sent on at the second signal output 87 to the second conductor 74. The first high frequency signal and the second high frequency signal are signals that are independent of each other in the manner already described. For example, the second high frequency signal may not be derived from the first high frequency signal by a simple passive or active circuit, and vice versa. The first high frequency signal and the second high frequency signal may be, for example, magnetic resonance signals of different antenna coils from different bodily regions. According to one or more of the present embodiments, the first high frequency signal and the second high frequency signal are transmitted independently of each other to an end of the transmission line that is remote from the first signal driver and the second signal driver. In other words, the first high frequency signal and the second high frequency signal are essentially unchanged after the transmission (e.g., with the exception of a constant attenuation and phase shift). For example, a crosstalk attenuation between the two high frequency signals is greater than 15, 20, 30, or 40 dB.

Although the invention has been illustrated and described in detail by the exemplary embodiments, the invention is not limited by the examples disclosed. Other variations may be derived from same by a person skilled in the art without departing from the scope of protection of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A transmitting device for transmitting a first high frequency signal and a second high frequency signal for a magnetic resonance tomograph, the transmitting device comprising:
    a balanced transmission line for transmitting the first high frequency signal and the second high frequency signal, wherein the first high frequency signal differs from the second high frequency signal in frequency;
    a first signal driver, wherein a first signal input of the first signal driver is configured to receive the first high frequency signal, and wherein a first signal output of the first signal driver has an electrical connection to a first conductor of the balanced transmission line;
    a second signal driver, wherein a second signal input of the second signal driver is configured to receive the second high frequency signal, and wherein a second signal output of the second signal driver has an electrical connection to a second conductor of the balanced transmission line,
    wherein the balanced transmission line has a common shielding that surrounds the first conductor and the second conductor of the balanced transmission line jointly,
    wherein the common shielding of the balanced transmission line has an electrical connection to a common ground potential for the first signal output and the second signal output, and
    wherein a whole length of the balanced transmission line essentially corresponds to an integer multiple m of a half effective wavelength of the first high frequency signal and essentially to an integer multiple n of a half effective wavelength of the second high frequency signal.

2. The transmitting device of claim 1, wherein the transmitting device is configured to transmit the first high frequency signal and the second high frequency signal independently of each other.

3. The transmitting device of claim 1, wherein the first conductor of the balanced transmission line has an electrical connection to the second conductor via a decoupling resistor at an end of the balanced transmission line that is remote from the first signal driver and the second signal driver.

4. The transmitting device of claim 3, wherein the decoupling resistor has a complex impedance.

5. The transmitting device of claim 1, wherein the transmitting device has a plurality of balanced transmission lines, a plurality of first signal drivers, and a plurality of second signal drivers for transmitting a plurality of first high frequency signals and second high frequency signals,
    wherein the common shielding surrounds the respective first conductor and the respective second conductor of each balanced transmission line of the plurality of balanced transmission lines.

6. The transmitting device of claim 1, wherein the first conductor and the second conductor of the balanced transmission line are in each case terminated for the purpose of shielding by a terminating resistor corresponding to a line impedance of the first conductor and the second conductor at an end of the transmission line that is remote from the first signal driver and the second signal driver.

7. The transmitting device of claim 1, wherein the first high frequency signal has a first center frequency and the second high frequency signal has a second center frequency, and
    wherein the first center frequency and the second center frequency are different.

8. The transmitting device of claim 1, wherein the first high frequency signal and the second high frequency signal are intermediate frequency signals of the magnetic resonance tomograph.

9. A magnetic resonance tomograph comprising:
    a transmitting device for transmitting a first high frequency signal and a second high frequency signal for a magnetic resonance tomograph, the transmitting device comprising:
        a balanced transmission line for transmitting the first high frequency signal and the second high frequency signal, wherein the first high frequency signal differs from the second high frequency signal in frequency;
        a first signal driver, wherein a first signal input of the first signal driver is configured to receive the first high frequency signal, and wherein a first signal output of the first signal driver has an electrical connection to a first conductor of the balanced transmission line;
        a second signal driver, wherein a second signal input of the second signal driver is configured to receive the second high frequency signal, and wherein a second signal output of the second signal driver has an electrical connection to a second conductor of the balanced transmission line,
    wherein a shielding of the balanced transmission line has an electrical connection to a common ground potential for the first signal output and the second signal output, and
    wherein a whole length of the balanced transmission line essentially corresponds to an integer multiple m of a half effective wavelength of the first high frequency signal and essentially to an integer multiple n of a half effective wavelength of the second high frequency signal.

10. The magnetic resonance tomograph of claim 9, further comprising:
a local coil; and
a receiving device,
wherein the transmitting device creates a signal link between the local coil and the receiving device.

11. The magnetic resonance tomograph of claim 10, wherein the first high frequency signal, the second high frequency signal, or the first high frequency signal and the second high frequency signal are magnetic resonance signals, intermediate frequency signals, or local oscillator signals, or are assembled from magnetic resonance signals, intermediate frequency signals, or local oscillator signals into a combined signal.

12. The magnetic resonance tomograph of claim 11, wherein the receiving device has a digital signal processing function for processing the signals received from the transmitting device, and
wherein the digital signal processing function is configured to compensate at least partly for a crosstalk between the signals.

13. The magnetic resonance tomograph of claim 10, wherein the receiving device has a digital signal processing function for processing the signals received from the transmitting device, and
wherein the digital signal processing function is configured to compensate at least partly for a crosstalk between the signals.

14. The magnetic resonance tomograph of claim 9, wherein the first high frequency signal, the second high frequency signal, or the first high frequency signal and the second high frequency signal are magnetic resonance signals, intermediate frequency signals, or local oscillator signals, or are assembled from magnetic resonance signals, intermediate frequency signals, or local oscillator signals into a combined signal.

15. The magnetic resonance tomograph of claim 14, wherein the first high frequency signal has a first center frequency and the second high frequency signal has a second center frequency, and
wherein the first center frequency differs from the second center frequency by more than 30%, 50%, 100%, or a multiple.

16. The magnetic resonance tomograph of claim 14, wherein the first high frequency signal and the second high frequency signal are intermediate frequency signals of the magnetic resonance tomograph.

17. A method for transmitting a first high frequency signal and a second high frequency signal for a magnetic resonance tomograph with a transmitting device, the transmitting device comprising a balanced transmission line, a first signal driver with a first signal input and a first signal output that has an electrical connection to a first conductor of the balanced transmission line, a second signal driver with a second signal input and a second signal output that has an electrical connection to a second conductor of the balanced transmission line, and a shielding of the balanced transmission line, wherein the shielding has an electrical connection to a common ground potential for the first signal output and the second signal output, the method comprising:
feeding the first high frequency signal to the first signal input of the first signal driver and sending the first high frequency signal on at the first signal output to the first conductor; and
feeding the second high frequency signal to the second signal input of the second signal driver and sending the second high frequency signal on at the second signal output to the second conductor,
wherein the first high frequency signal is independent of the second high frequency signal, the first high frequency signal and the second high frequency signal are transmitted independently of each other to an end of the transmission line that is remote from the first signal driver and the second signal driver, and the first high frequency signal differs from the second high frequency signal in frequency, and
wherein a whole length of the balanced transmission line essentially corresponds to an integer multiple m of a half effective wavelength of the first high frequency signal and essentially to an integer multiple n of a half effective wavelength of the second high frequency signal.

18. The method of claim 17, wherein the first high frequency signal and the second high frequency signal are intermediate frequency signals of the magnetic resonance tomograph.

* * * * *